(12) United States Patent
Rathor et al.

(10) Patent No.: US 8,803,120 B2
(45) Date of Patent: Aug. 12, 2014

(54) DIODE AND RESISTIVE MEMORY DEVICE STRUCTURES

(75) Inventors: Manuj Rathor, Milpitas, CA (US); An Chen, Sunnyvale, CA (US); Steven Avanzino, Cupertino, CA (US); Suzette K. Pangrle, Cupertino, CA (US)

(73) Assignee: Spansion, LLC, Sunnyvale, CA (US)

( * ) Notice: Subject to any disclaimer, the term of this patent is extended or adjusted under 35 U.S.C. 154(b) by 336 days.

(21) Appl. No.: 13/271,129

(22) Filed: Oct. 11, 2011

(65) Prior Publication Data

US 2012/0025161 A1 Feb. 2, 2012

Related U.S. Application Data

(62) Division of application No. 12/072,588, filed on Feb. 27, 2008, now Pat. No. 8,035,099.

(51) Int. Cl.
*H01L 45/00* (2006.01)
*H01L 27/102* (2006.01)
*H01L 27/10* (2006.01)
*H01L 27/24* (2006.01)

(52) U.S. Cl.
CPC ......... *H01L 27/1021* (2013.01); *H01L 45/1253* (2013.01); *H01L 45/04* (2013.01); *H01L 27/101* (2013.01); *H01L 27/24* (2013.01)
USPC .......................................................... 257/4

(58) Field of Classification Search
CPC ......... H01L 45/04; H01L 45/06; H01L 27/24; H01L 27/101; H01L 27/1021; H01L 45/1253
USPC ............. 257/2, 4, E45.003; 365/46, 100, 148
See application file for complete search history.

(56) References Cited

U.S. PATENT DOCUMENTS

| | | | |
|---|---|---|---|
| 6,180,444 B1 | 1/2001 | Gates et al. | |
| 6,855,975 B2 * | 2/2005 | Gilton | 257/296 |
| 6,870,755 B2 | 3/2005 | Rinerson et al. | |
| 7,102,156 B1 * | 9/2006 | Kingsborough et al. | 257/40 |
| 7,141,482 B1 * | 11/2006 | Avanzino | 438/387 |
| 7,391,064 B1 * | 6/2008 | Tripsas et al. | 257/213 |
| 2002/0102839 A1 | 8/2002 | Gonzalez et al. | |
| 2006/0214183 A1 | 9/2006 | Gaun et al. | |

* cited by examiner

*Primary Examiner* — Nikolay Yushin (57) ABSTRACT

In an electronic device, a diode and a resistive memory device are connected in series. The diode may take a variety of forms, including oxide or silicon layers, and one of the layers of the diode may make up a layer of the resistive memory device which is in series with that diode.

4 Claims, 9 Drawing Sheets

FIGURE 26

DIODE AND RESISTIVE MEMORY DEVICE STRUCTURES

CROSS-REFERENCE TO RELATED APPLICATIONS

This application is a divisional of U.S. patent application Ser. No. 12/072,588, filed on Feb. 27, 2008, entitled "Diode and Resistive Memory Device Structures," which is hereby incorporated herein by reference in their entirety.

BACKGROUND OF THE INVENTION

1. Field of the Invention

This invention relates generally to electronic devices, and more particularly, to designs of diodes and resistive memory devices.

2. Discussion of the Related Art

Figure 1:
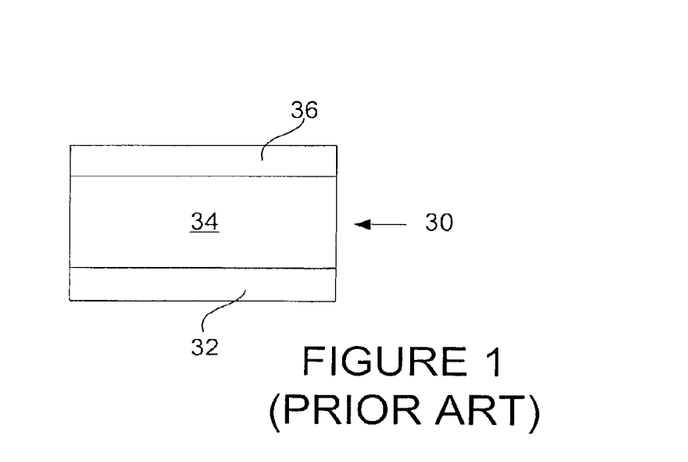
FIG. 1 illustrates a conventional diode.
Figure 2:
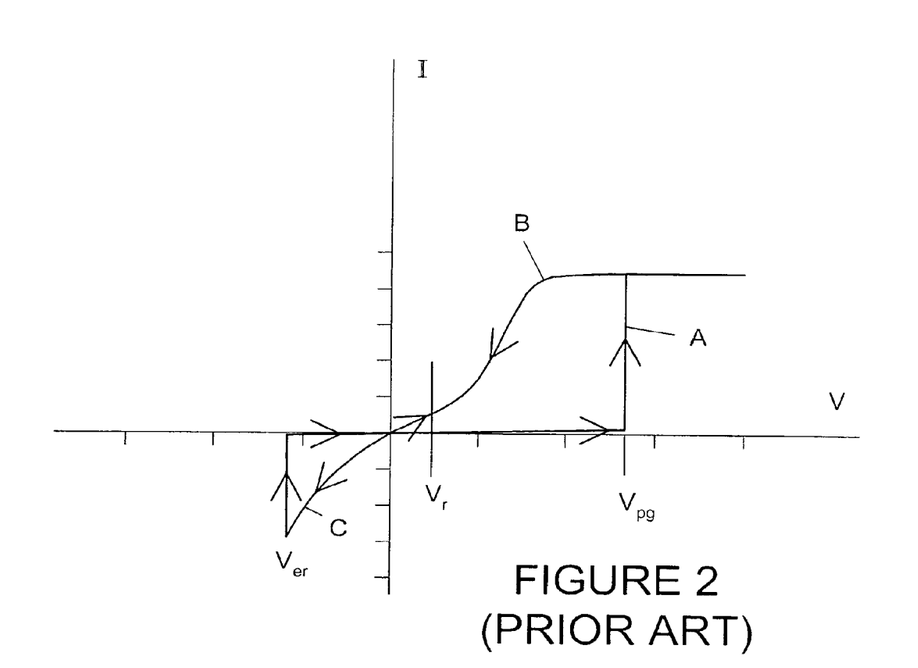
FIG. 2 illustrates the operating characteristics of the diode of FIG. 1.

FIG. 1 illustrates a type of resistive memory device 30. The memory device 30 includes an electrode 32, a switching or active layer 34 on the electrode 32, and an electrode 36 on the switching layer 34. Initially, assuming that the memory device 30 is unprogrammed, in order to program the memory device 30, ground is applied to the electrode 32, while a positive voltage is applied to electrode 36, so that an electrical potential $V_{pg}$ is applied across the memory device 30 from a higher to a lower electrical potential in the direction from electrode 36 to electrode 32. This causes electronic charge carriers in the form of electrons and/or holes to enter the layer 34, to provide that the overall memory device 30 is in a conductive, low-resistance (programmed) state (A, FIG. 2). Upon removal of such potential the memory device 30 remains in a conductive or low-resistance state having an on-state resistance illustrated at B.

In the read step of the memory device 30 in its programmed (conductive) state, an electrical potential $V_r$ is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 130 will readily conduct current, which indicates that the memory device 30 is in its programmed state.

In order to erase the memory device 30, a positive voltage is applied to the electrode 32, while the electrode 36 is held at ground, so that an electrical potential $V_{er}$ is applied across the memory device 30 from a higher to a lower electrical potential in the direction of from electrode 32 to electrode 36. Application of this electrical potential causes electronic charge carriers to leave the layer 34 (C), switching the layer 34 to a high-resistance state, so that the overall memory device 30 is in a high-resistance (erased) state.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the layer 34 (and memory device 30) in a high-resistance or substantially non-conductive state, the memory device 30 will not conduct significant current, which indicates that the memory device 30 is in its erased state.

Figure 3:
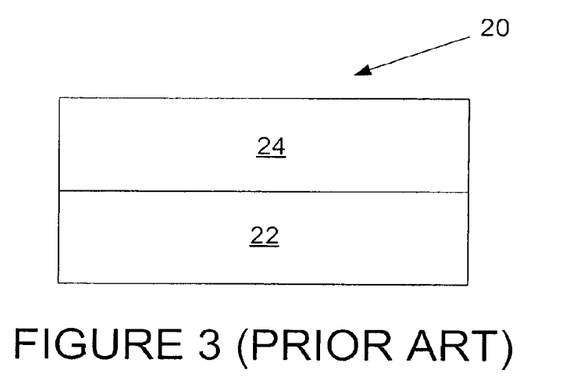
FIG. 3 illustrates a form of resistive memory device.
Figure 4:
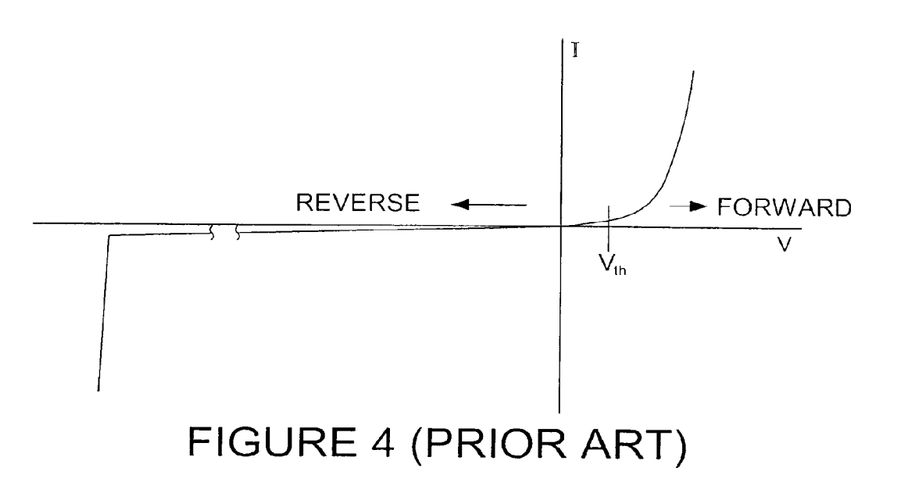
FIG. 4 illustrates the operating characteristics of the device of FIG. 4.

The structure and operation of conventional semiconductor diodes are well known. Typically, a diode 20 is formed by providing adjoining p and n layers 22, 24 of material, to form a p-n junction (FIG. 3). Increasing electrical potential applied across the diode 20 in the forward direction overcomes the threshold voltage $V_{th}$ of the diode 20, which then conducts current in the forward direction, the level of current being determined by the (relatively low) on-resistance of the diode 20. Increasing electrical potential applied across the diode 20 in the reverse direction does not cause significant conduction of current until breakdown occurs (at a relatively high voltage), whereupon the diode 20 then conducts current in the reverse direction (FIG. 4).

Figure 5:
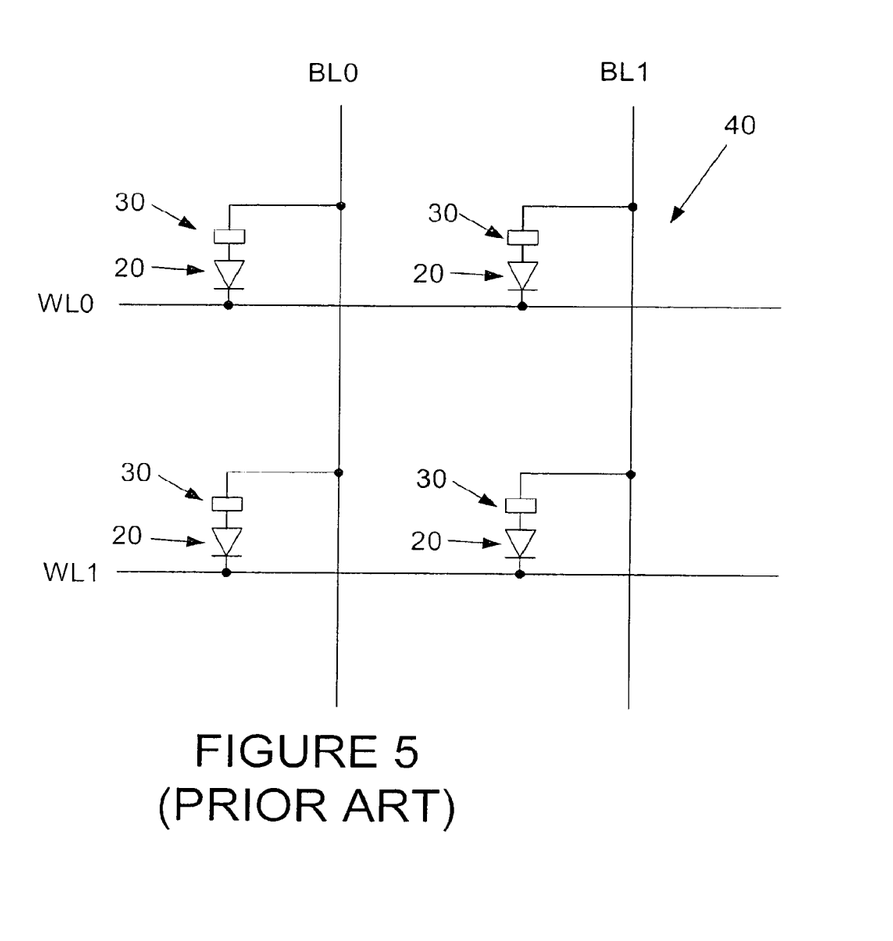
FIG. 5 illustrates a memory array incorporating resistive memory devices and diodes of FIGS. 1 and 3.

Diodes of this type are used as access devices for resistive memory devices in an array 40 including bit lines BL0, BL1, ... and word lines WL0, WL1, ... (FIG. 5). In certain situations, such as when the diodes 20 are used as access devices for resistive memory devices 30 in a three-dimensional memory array (one array layer shown in FIG. 5), where resistive memory devices are already fabricated on a previously formed array layer, a low temperature diode fabrication sequence is needed in order not to alter or destroy the operational characteristics of devices already formed.

As will be understood, improvements in manufacturing and operational efficiency of such a resistive memory device are being sought, particularly when used in a memory array with access diodes associated therewith.

Therefore, what is needed is an approach for improving these devices for these particular needs.

SUMMARY OF THE INVENTION

Broadly stated, the present invention is a diode comprising a first layer comprising an oxide, and a second layer comprising an oxide in contact with the first layer.

Broadly stated, the invention is further an electronic device comprising a diode and a resistive memory device in series, the diode comprising a first layer comprising an oxide, and a second layer comprising an oxide in contact with the first layer, the resistive memory device comprising a first electrode comprising one of the layers of the diode, a switching layer, and a second electrode.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 6:
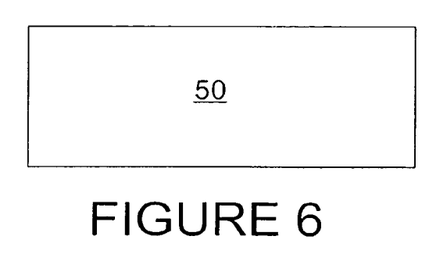
FIG. 6-10 illustrate process steps in forming an embodiment of the invention.
Figure 7:
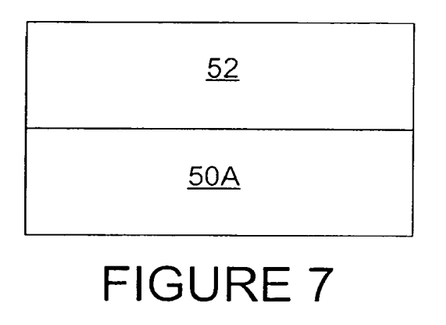
Figure 8:
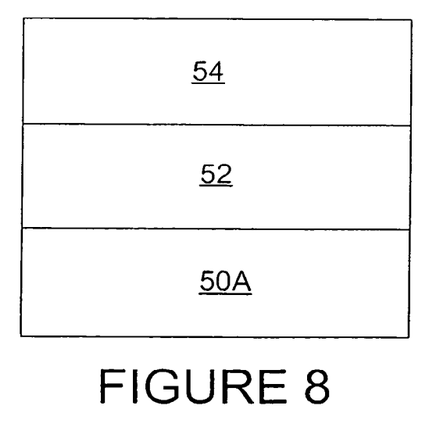
Figure 9:
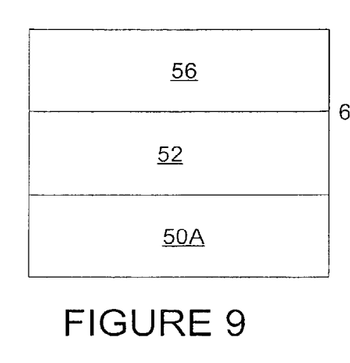
Figure 10:
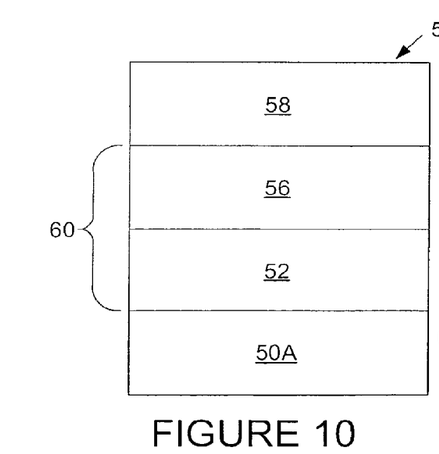

FIGS. 6-10 illustrate the fabrication of a diode in accordance with the present invention. In this particular embodiment, a Ni layer 50 is provided to a thickness of approximately 5000 Å (FIG. 6). With reference to FIG. 7, an oxidation step is undertaken, either thermally or with an O/O$_2$ containing plasma such that a NiO$_x$ oxide layer 52 is formed to a thickness of 1000-2000 Å on the remaining Ni 50A. Next (FIG. 8), a Ti layer 54 is deposited on the NiO$_x$ layer 52, and this Ti layer 54 is fully oxidized (FIG. 9) to form a TiO$_x$ layer 56 on and in contact with the NiO$_x$ layer 52. Finally (FIG. 10), a metal layer 58 is deposited on the TiO$_x$ layer 56, so that the resulting structure 59 as shown in FIG. 10 is formed. The metal oxide NiO$_x$ is known to be a p type semiconductor, while the TiO$_x$ is known to be an n type semiconductor. The TiO$_x$ and NiO$_x$ layers form a diode 60, while the remaining Ni layer 50A and metal layer 58 form ohmic contact to the diode 60. All fabrication steps, including the oxidation steps described above, are undertaken at relatively low temperatures to achieve the object pointed out above. That is, through this low temperature diode fabrication sequence, operational characteristics of devices already formed are not altered, which might very well be the case if higher temperatures were used.

Other metal oxides such as CuO$_x$ and CoO$_x$ are also known to be p type semiconductors, while other metal oxides such as ITO and ZnO$_x$ are known to be n type semiconductors. The process described above could readily be changed to incorporate these oxides as appropriate in forming the overall structure.

Figure 11:
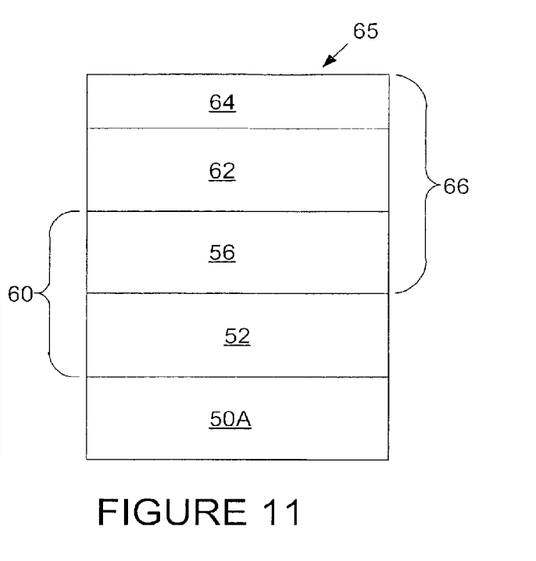
FIG. 11 illustrates an alternative step to the step of FIG. 10.

An alternative to the step described with regard to FIG. 10 is shown in FIG. 11. As such, after the structure of FIG. 9 is formed, an oxide switching layer 62 is provided on the layer 56, and a metal layer 64 is provided on the layer 62, forming the overall structure 65. In this structure 65, again, the layers 52, 56 form a diode 60, while the layers 56, 62, 64 form a resistive memory device 66, with the layer 56 acting both as a layer of the diode 60 and an electrode of the resistive memory device 66, so that the diode 60 and resistive memory device 66 are in series.

Figure 12:
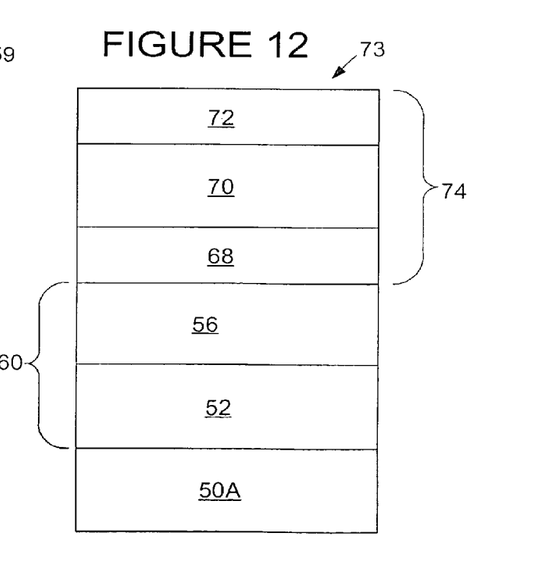
FIG. 12 illustrates another alternative step to the step of FIG. 10.

FIG. 12 shows yet another alternative to the approach shown with regard to FIG. 10. Again, starting with the structure of FIG. 9, and with direct reference to FIG. 12, a bottom electrode 68 is formed on the layer 56, a switching oxide layer 70 is formed on the electrode 68, and a top electrode 72 is formed on the switching layer 70. This results in the overall structure shown at 73. As such, again, the layers 52, 56 form a diode 60, while the layers 68, 70, 72 form a resistive memory device 74 in series with that diode 60.

Figure 13:
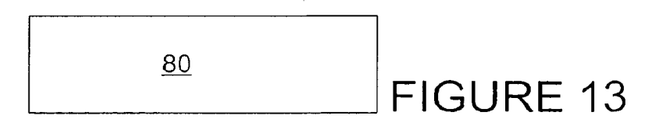
FIG. 13-16 illustrate process steps in forming another embodiment of the invention.
Figure 14:
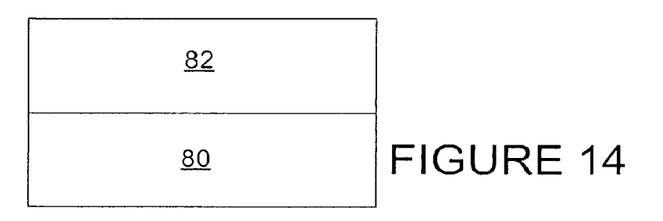
Figure 15:
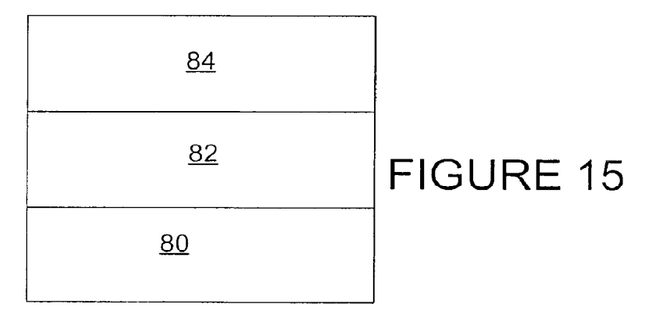
Figure 16:
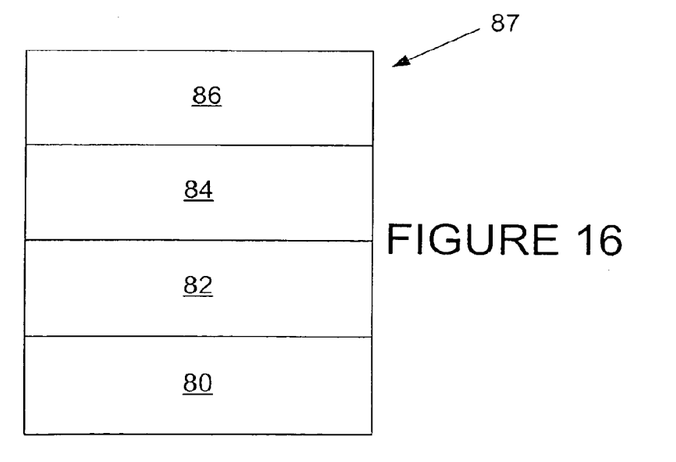

FIGS. 13-16 illustrate another embodiment of the invention. As shown in FIG. 13, a silicon layer 80 of a first conductivity type is provided. This layer 80 may be either amorphous silicon, polycrystalline silicon, or epitaxial silicon (including single-crystal epitaxial silicon). Provided on the layer 80 is another layer 82 of silicon of a conductivity type opposite the conductivity type of the layer 80. This layer may also be amorphous silicon, polycrystalline silicon or epitaxial silicon (including single-crystal epitaxial silicon). These two layers 80, 82 form a diode. Provided on the silicon layer 82 is an oxide switching layer 84 (FIG. 15), of for example, Al$_x$O$_y$, HfO$_x$, HfSiO$_x$, ZrO$_x$, TiO$_x$, CuO$_x$, or Ta$_x$O$_y$. Provided on this layer 84 is an electrode 86 of, for example, metal, i.e., Ni, Co, Pt, Ta, Ti, or W, or a metal nitride, i.e., Tin, Tan, or Wn, or an n type polycrystalline silicon material. This makes up the structure 87. In this embodiment, the layers 80, 82 make up a diode 88, while the layers 82, 84, 84 make up a resistive memory device 90, so that the layer 82 is both a portion of the diode 88 and an electrode of the resistive memory device 90, with the diode 88 and resistive memory device 90 in series.

Figure 17:
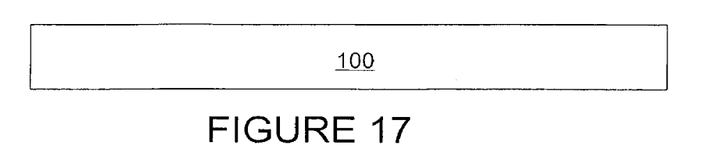
FIGS. 17-22 illustrate process steps in forming yet another embodiment of the invention.
Figure 18:
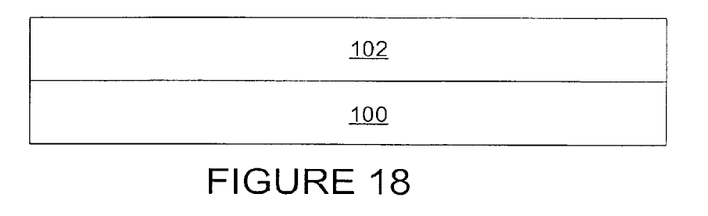
Figure 19:
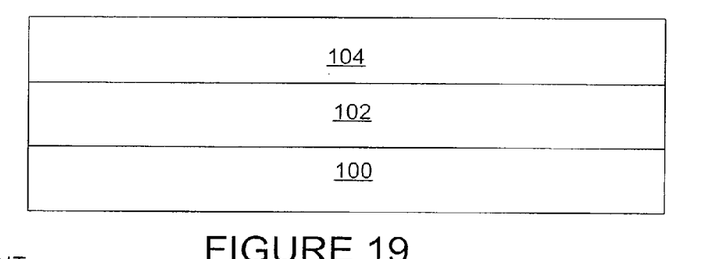
Figure 20:
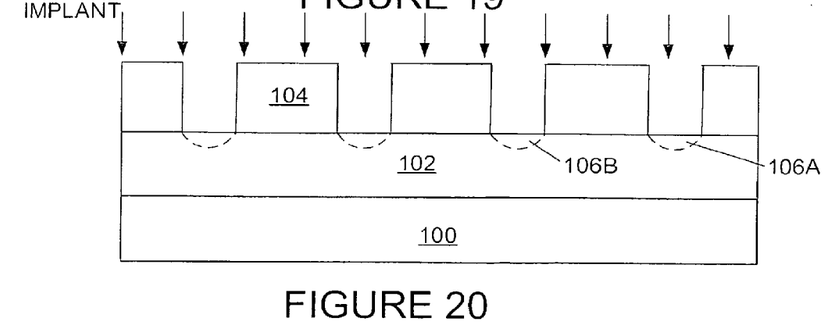

FIGS. 17-22 illustrate fabrication of another embodiment of the invention. Initially, as shown in FIG. 17, an electrode 100 of for example, metal, is provided. A silicon layer 102 of a first conductivity type, either amorphous or polycrystalline silicon, is provided on the electrode 100 (FIG. 18). With reference to FIG. 19, an interlayer dielectric 104 is formed on the silicon layer 102, and the interlayer dielectric 104 is patterned by appropriate photoresist techniques to provide openings therethrough to the silicon layer 102 lying therebelow (FIG. 20).

Figure 21:
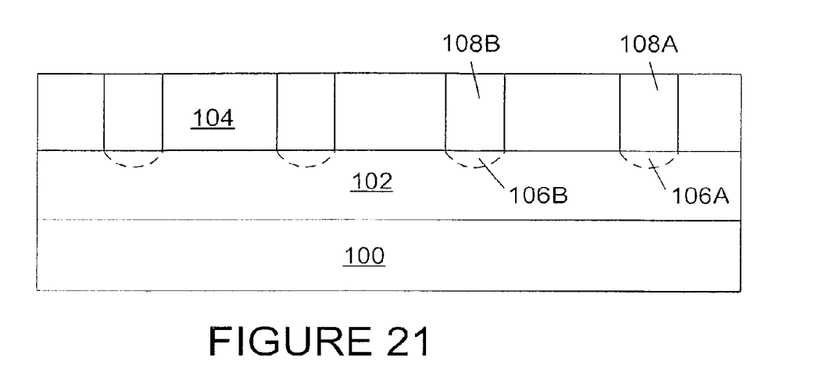
Figure 22:
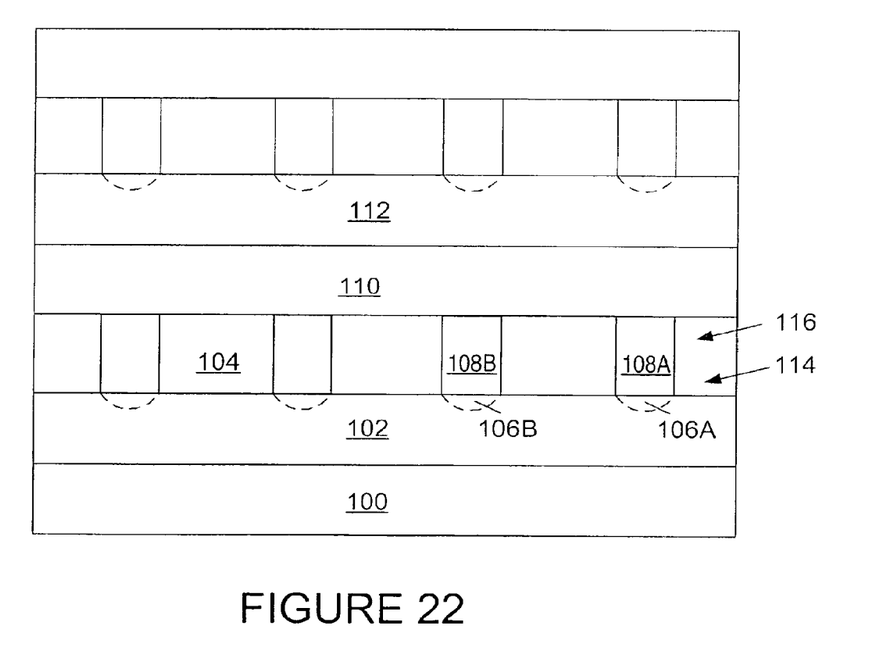

With further reference to FIG. 20, an implant step is undertaken, using the patterned interlayer dielectric as a mask, to form regions 106A, 106B, . . . in the silicon layer 102 of a conductivity type opposite that of the silicon layer 102 itself. Next, switching oxide 108A, 108B, . . . is provided in each of the openings in the interlayer dielectric layer by for example deposition, and a polishing step is undertaken to planarize the resulting structure (FIG. 21). Then, an electrode 110 of metal is provided over the resulting structure (FIG. 22). Another silicon layer 112 is provided over the resulting structure, and the process thus far described is repeated to form the multilayer structure of FIG. 22.

As an example, the silicon of the layer 102 and the silicon of the implanted region 106A form a diode 114. The silicon of the implanted region 106A, the oxide region 108A, and the electrode 110 form a resistive memory device 116 in series with that diode 114. In this way, a multi-level structure can be formed. As in the formation of the diode of FIGS. 6-10, all fabrication steps are undertaken at relatively low temperatures to achieve the object pointed out above. That is, through this low temperature diode fabrication sequence, operational characteristics of devices already formed are not altered, which might very well be the case if higher temperatures were used.

Figure 23:
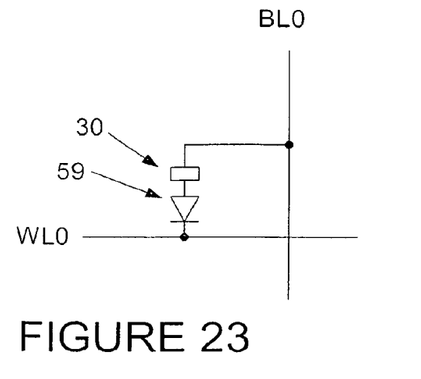
FIGS. 23-26 illustrate portions of memory arrays incorporating resistive memory devices and diodes in accordance with the present invention.
Figure 24:
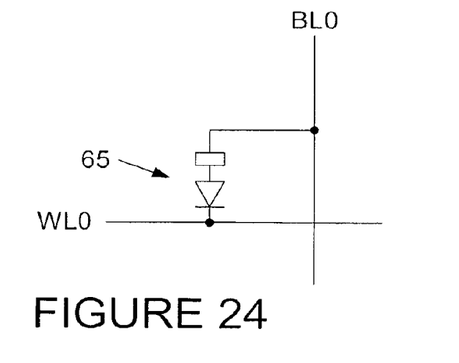
Figure 25:
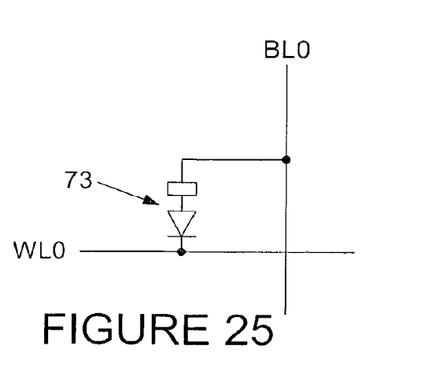
Figure 26:
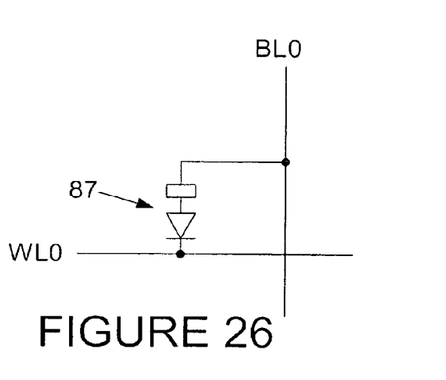

FIGS. 23-26 illustrate examples of the use of the various embodiments of the present invention. With reference to FIG. 23, the resistive memory device 30 of FIG. 1 can be placed in series with the diode 59 of FIG. 10, so that the resulting structure runs in series between BL0 and WL0. FIG. 24 shows the structure of 65 of FIG. 11 connected in series between BL0 and WL0. FIG. 25 illustrates the device 73 of FIG. 12 connected in series between BL0 and WL0. FIG. 26 illustrates the device 87 of FIG. 16 connected in series between BL0 and WL0.

It will therefore be seen that low-temperature fabrication sequences are provided as desired. Also, various embodiments of resistive memory devices with high manufacturing and operational efficiency are herein provided.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic device comprising:
a diode and a resistive memory device in series, the diode comprising a layer comprising a region of a first conductivity type and a region of a second conductivity type opposite the first conductivity type, the resistive memory device comprising a first electrode comprising the region of the first conductivity type of the diode comprising the region of first conductivity type and the region of second conductivity type, a switching layer, and a second electrode.

2. The electronic device of claim 1 wherein the layer comprising a region of a first conductivity type and a region of a second conductivity type opposite the first conductivity type comprises silicon.

3. The electronic device of claim 2 wherein the silicon comprises amorphous silicon.

4. The electronic device of claim 2 wherein the silicon comprises polycrystalline silicon.

* * * * *